United States Patent
Mitsuyama et al.

(10) Patent No.: US 7,977,700 B2
(45) Date of Patent: Jul. 12, 2011

(54) RESIN AND METAL SEMICONDUCTOR DEVICE PACKAGE AND SEMICONDUCTOR LIGHT-EMITTING DEVICE INCORPORATING THE PACKAGE

(75) Inventors: Hiroshi Mitsuyama, Tokyo (JP); Kotaro Yajima, Tokyo (JP); Naokazu Terai, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 302 days.

(21) Appl. No.: 12/348,027

(22) Filed: Jan. 2, 2009

(65) Prior Publication Data
US 2009/0321777 A1    Dec. 31, 2009

(30) Foreign Application Priority Data
Jun. 26, 2008  (JP) ................. 2008-167148

(51) Int. Cl.
*H01L 23/498* (2006.01)
*H01L 33/48* (2010.01)

(52) U.S. Cl. ... 257/99; 257/668; 257/690; 257/E33.056; 257/E33.066

(58) Field of Classification Search ........... 257/E33.066
See application file for complete search history.

(56) References Cited

U.S. PATENT DOCUMENTS

| | | | | |
|---|---|---|---|---|
| 5,177,593 A | * | 1/1993 | Abe | 257/98 |
| 5,291,038 A | * | 3/1994 | Hanamoto et al. | 257/82 |
| 6,091,136 A | * | 7/2000 | Jiang et al. | 257/676 |

FOREIGN PATENT DOCUMENTS

| | | |
|---|---|---|
| JP | 10-154848 A | 6/1998 |
| JP | 11-177150 A | 7/1999 |

* cited by examiner

*Primary Examiner* — Stephen W Smoot
(74) *Attorney, Agent, or Firm* — Leydig, Voit & Mayer, Ltd.

(57) ABSTRACT

A semiconductor package and a semiconductor light-emitting device including the semiconductor package. The semiconductor package includes: a frame for mounting a semiconductor light-emitting element; and a lead integral with the frame. The frame and the lead are made of a resin. A metal film is located in a predetermined area on the frame.

16 Claims, 6 Drawing Sheets

RESIN AND METAL SEMICONDUCTOR DEVICE PACKAGE AND SEMICONDUCTOR LIGHT-EMITTING DEVICE INCORPORATING THE PACKAGE

CROSS-REFERENCE TO RELATED APPLICATIONS

This application is based upon and claims the benefit of priority from Japanese Patent Application No. 2008-167148, filed Jun. 26, 2008, the entire contents of which are incorporated herein by reference.

BACKGROUND OF THE INVENTION

1. Field of the Invention

The present invention relates to a semiconductor package and a semiconductor light-emitting device, and more particularly to a semiconductor light-emitting device and a semiconductor package of an open package structure in which a semiconductor light-emitting element is mounted on a mount section of a frame.

2. Description of the Related Art

Since a light-emitting element, such as a semiconductor laser diode, is difficult to handle as a single element, the element is packaged. Since the light-emitting element self-heats when it is used, a package having a good heat radiation characteristic is required to release heat.

A can-type package has been used for a semiconductor optical device. In the package, a can that covers an optical semiconductor chip and that has a window into which a glass plate for leading light is sealed is placed on a header where the optical semiconductor chip is mounted, and the header and the can are sealed together. Recently, there has also been proposed a semiconductor laser device that has an optical semiconductor chip mounted in a mount section on a frame made of a metal plate by means of stamping, or the like, and that is molded by means of a resin-molded body. A semiconductor laser is described in JP-A-10-154848 as such a semiconductor laser device.

However, in the semiconductor laser that has an optical semiconductor chip mounted in a mount section on a frame and that is molded of a resin molded body, a metallic material, such as copper (Cu), is used for the frame, and the frame is made by stamping a metal plate, or the like, whence there is a problem of a high price of material and difficulty in cutting cost. There are also problems of difficulty in simplifying machining resulting from use of a metallic material and low productivity achieved during mass production.

SUMMARY OF THE INVENTION

The present invention has been conceived to solve the problems mentioned above and aims at providing a semiconductor optical device for which a reduction in material cost, simplification of machining, and enhancement of productivity are achieved by means of producing a material for a frame of a package from a resin and making a metal film on a mount section on the frame where an optical semiconductor chip is to be mounted.

According to an exemplary embodiment of the present invention, there is provided a semiconductor package including: a frame for mounting thereon a semiconductor light-emitting element; and a lead formed integrally with the frame, wherein the frame and the lead are made of a resin, and wherein a metal film is formed in a predetermined area on the frame.

According to another exemplary embodiment of the present invention, there is provided a semiconductor light-emitting device including: a frame; a semiconductor light-emitting element mounted on the frame; a lead formed integrally with the frame, wherein the frame and the lead are made of a resin, and wherein a metal film is formed in a predetermined area on the frame.

According to the above configuration, a metal film is formed in a predetermined area on the frame made of a resin, whereby material cost is reduced and machining is simplified. Thus, a semiconductor package and a semiconductor light-emitting device, which are enhanced in terms of productivity achieved during mass production, can be acquired.

BRIEF DESCRIPTION OF THE DRAWINGS

The above and other aspects of the present invention will become more apparent and more readily appreciated from the following description of exemplary embodiments of the present invention taken in conjunction with the attached drawings, in which.

DETAILED DESCRIPTION OF THE INVENTION

First Embodiment

Figure 1:
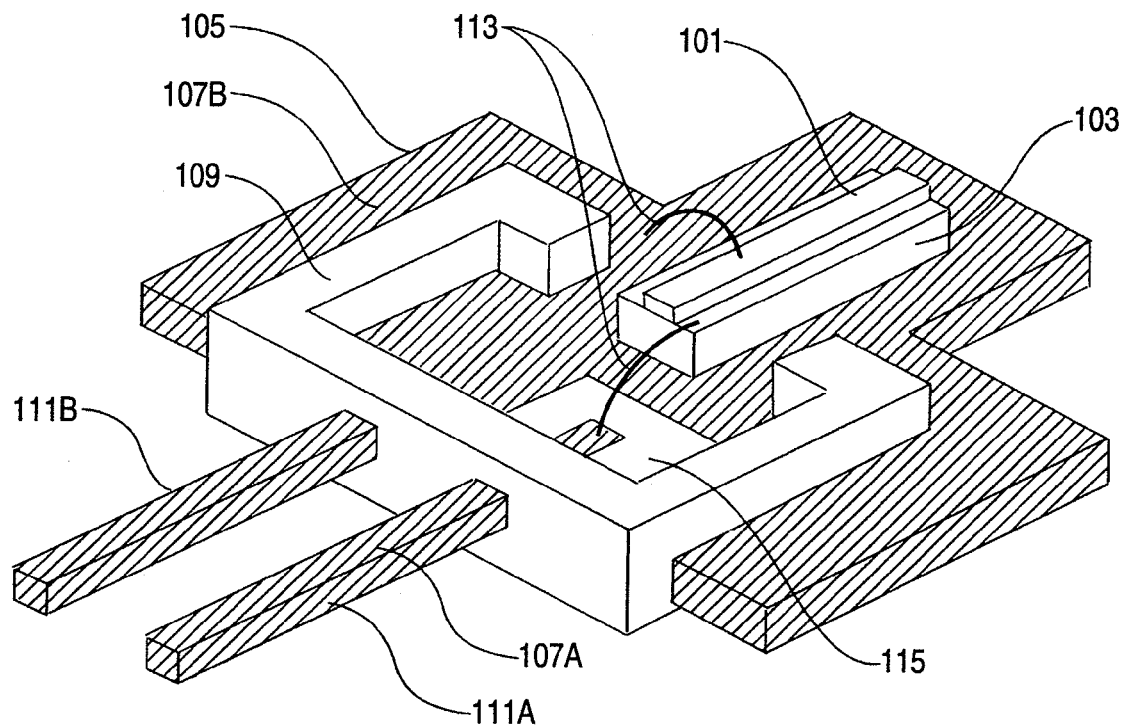
FIG. 1 is a perspective view schematically showing a semiconductor light-emitting device of an embodiment of the present invention.
Figure 2:
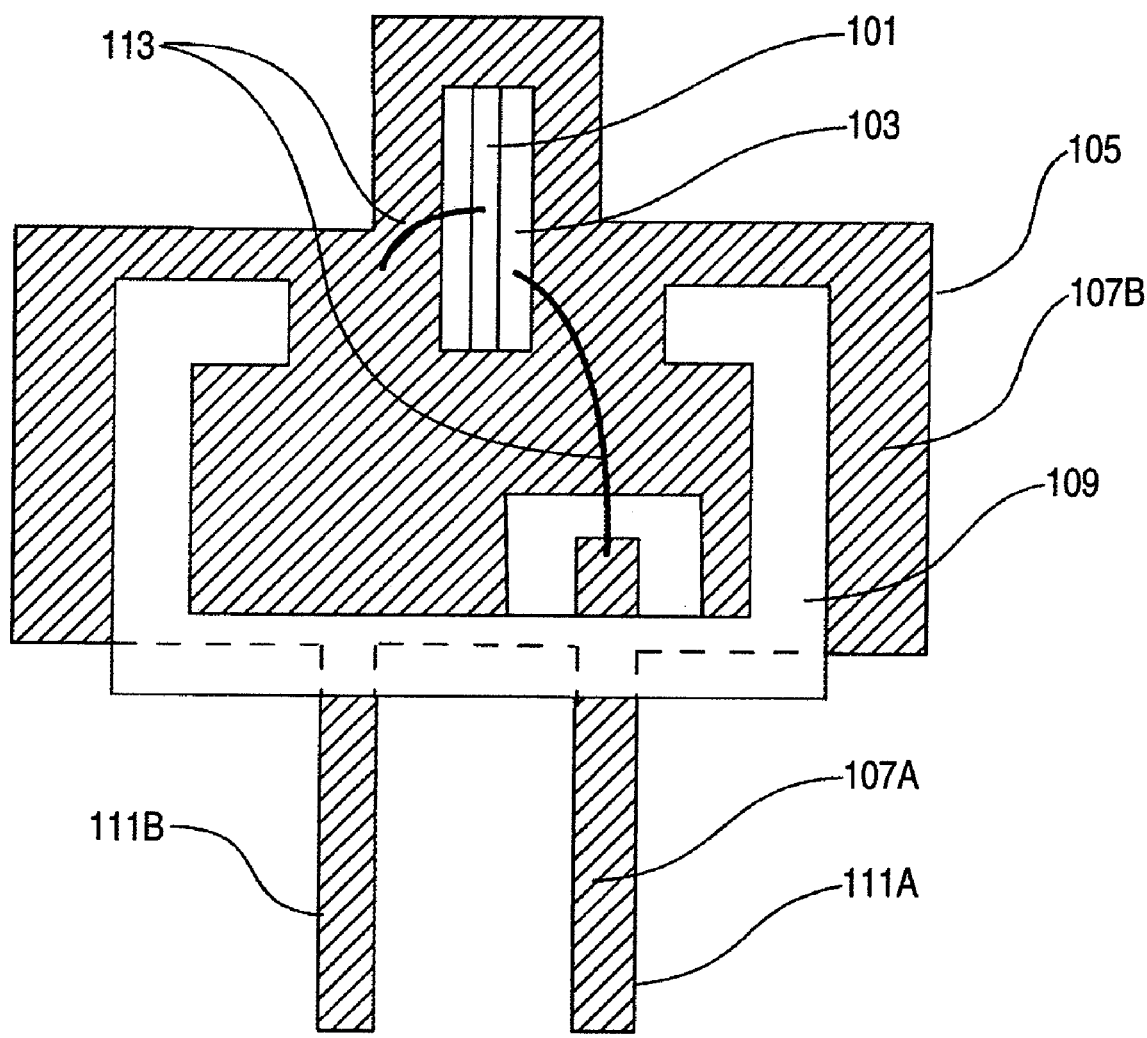
FIG. 2 is a top view schematically showing the semiconductor light-emitting device of the embodiment of the present invention.

FIG. 1 is a perspective view schematically showing a semiconductor light-emitting device of an embodiment of the present invention. FIG. 2 is a top view schematically showing the semiconductor light-emitting device of the embodiment of the present invention. The embodiment will be described by reference to FIGS. 1 and 2. A semiconductor laser chip 101 corresponding to a semiconductor light-emitting element is mounted on a sub-mount 103 fixed onto a frame 105. The frame 105 is configured by forming a metal film 107 on a base made of a resin, such as polyimide. The semiconductor laser chip 101 is mounted on the metal film 107 through the sub-mount. Plating, evaporation, sputtering, and the like, is used for generating the metal film 107. Further, nickel (Ni), copper (Cu), gold (Au), platinum (Pt), titanium (Ti), and the like, is used for a material of the metal film 107. Heat generated by the semiconductor laser chip 101 propagates to a metal film 107B, where the heat is released. The frame 105 and a lead 111 are formed integrally with each other, and the metal film 107B is formed except an exposed resin section 115 that is an insulation area around a lead 111A requiring insulation. The lead 111A is coated with the metal film 107A and insulated from the metal film 107B. The lead 111B is a GND terminal and coated with the metal film 107B, and the metal film 107B is brought into a ground potential. Next, although unillustrated, an electrode on the sub-mount 103 connected to the semiconductor laser chip 101 is wire-bonded to the lead 111A by a bonding wire 113. Moreover, the semiconductor laser chip 101 and the metal film 107B to be brought into a ground potential are wire-bonded together by the bonding wire 113, whereupon a semiconductor light-emitting device of the present embodiment is obtained.

As shown in FIG. 1, in the present embodiment, the frame 105 is formed from a resin, such as polyimide. Since the material of the package is changed from related-art metal to a resin and thermal conductivity thereof are difference from each other, a countermeasure to release heat of a light-emitting element is required. Accordingly, the frame 105 is configured by forming a metal film over the front and back surfaces of the resin base, to thus enhance a heat radiation characteristic of the frame. In the present embodiment, the metal film 107 is formed essentially overall the resin base and patterned so as to prevent generation of a metal film in only an area that requires insulation. Even when essentially the entire surface of the resin base is coated with the metal film so as to enhance the heat radiation characteristic as mentioned above, the amount of metal used becomes smaller when compared with the case where a metal frame is used, so that manufacturing cost can be reduced.

With regard to the lead 111, the metal film 107 is formed on a resin, to thus configure a lead section. In the case of the metal package, three sections; namely, a metal base section, the lead section, and an insulation section for insulating the base section from the lead section, are required. However, in the present embodiment, these sections can be formed from one member by forming metal films in areas of a resin, which is originally insulative, so that the numbers of processes and components can be reduced. Moreover, in the present embodiment since the sections are configured by one member and a plurality of products such as TAB film can be handled, work along a manufacturing line is facilitated.

First Modification

Figure 3:
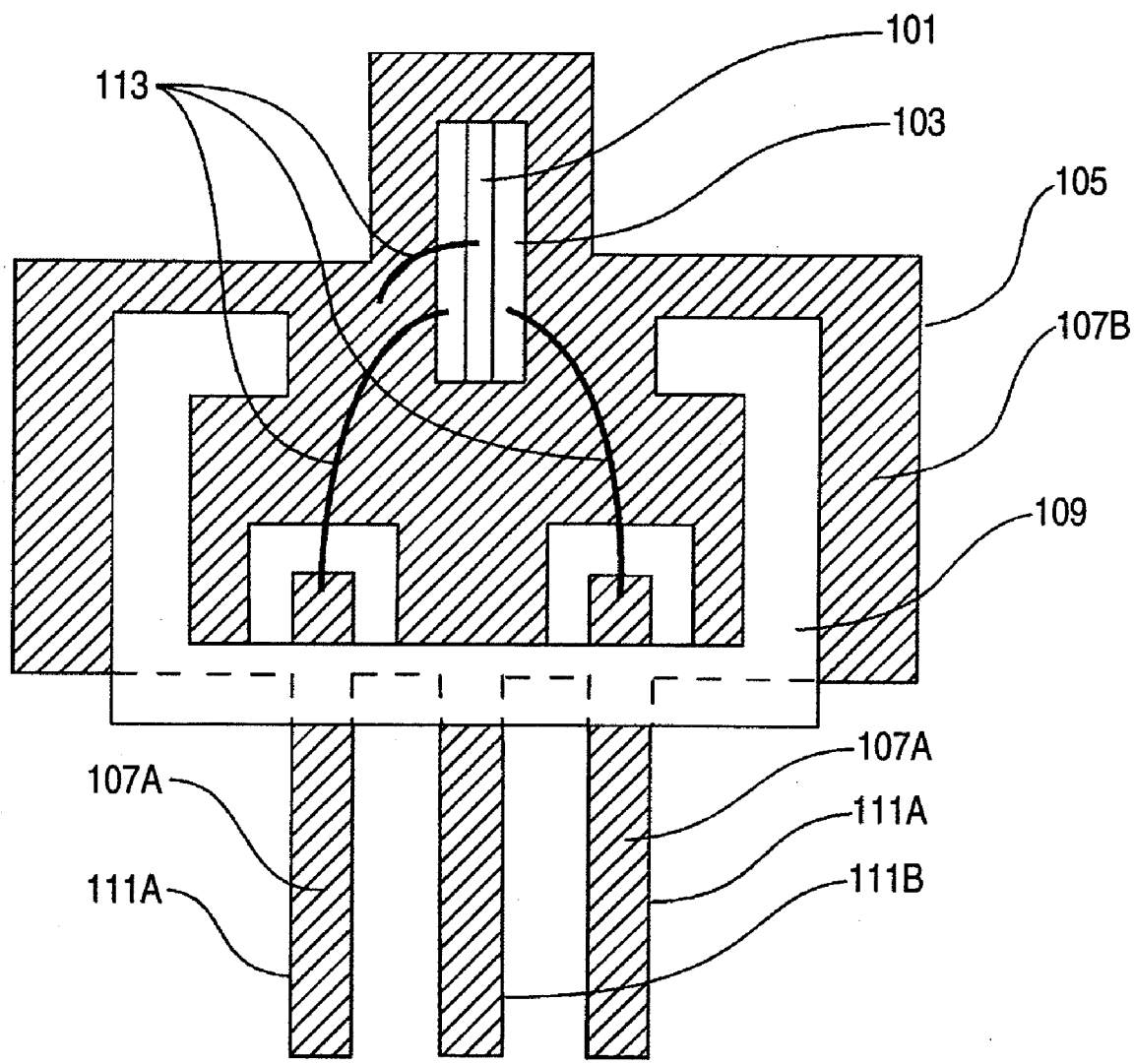
FIG. 3 is a schematic top view showing a semiconductor light-emitting device of another example of the embodiment of the present invention.

FIG. 3 is a schematic top view showing another semiconductor light-emitting device of the first embodiment of the present invention. The present modification shows a monolithic two-wavelength laser into which two laser chips; namely, the semiconductor laser chips 101 having different oscillation wavelengths, are assembled into one chip. A metal film is patterned in such a way that two leads requiring insulation are insulated from each other, and the respective leads are connected to the semiconductor laser chips 101 by a wire bonding. As mentioned above, only the areas requiring insulation are insulated, and the metal film is formed over the almost entire surface of the device, so that a heat radiation characteristic can be enhanced. Further, the areas requiring insulation can be insulated by patterning a metal film, so that machining can be easy.

Second Embodiment

Figure 4:
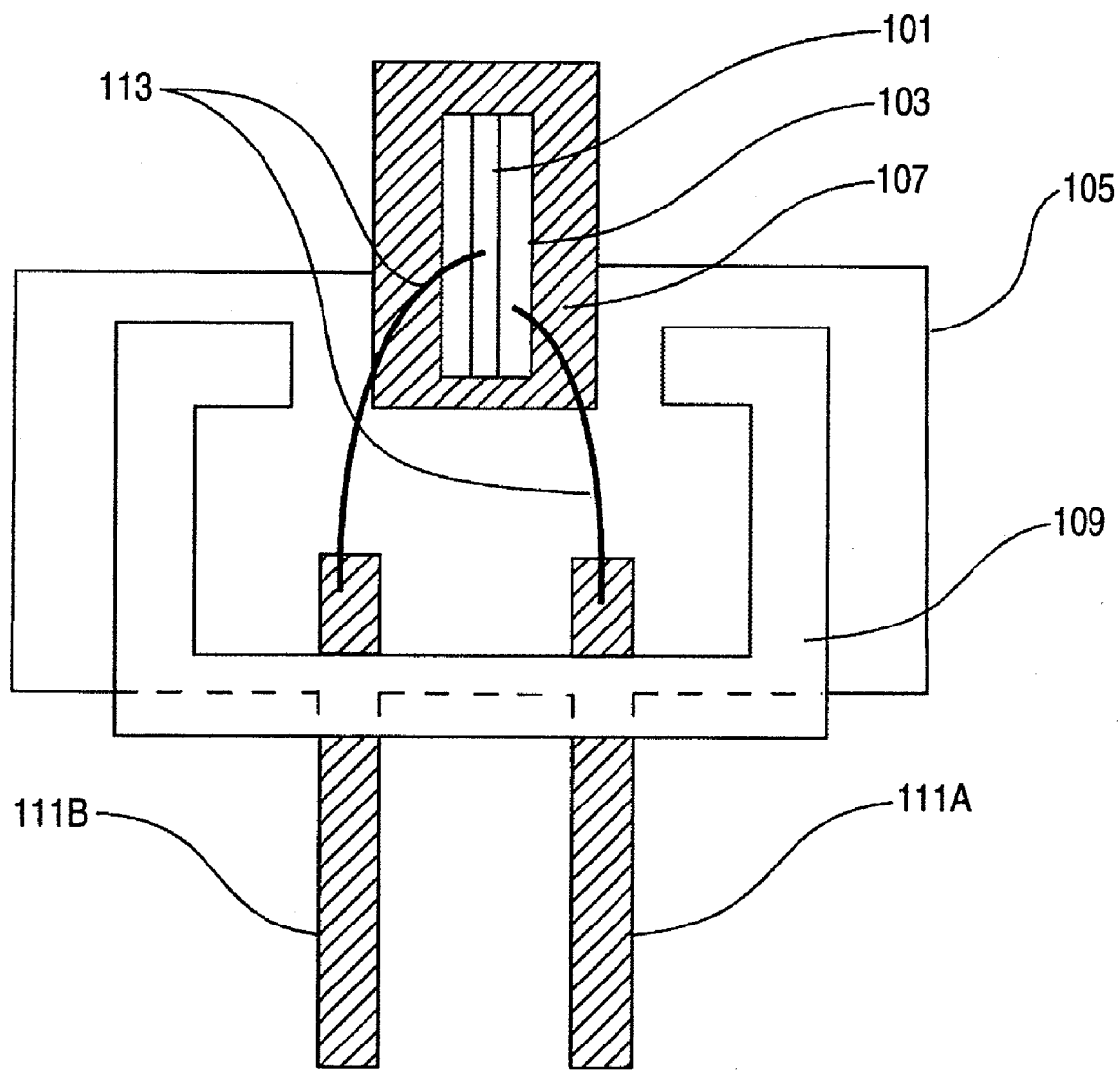
FIG. 4 shows a schematic top view showing a semiconductor light-emitting device of a second embodiment of the present invention.

FIG. 4 shows a schematic top view showing a semiconductor light-emitting device of a second embodiment of the present invention. Although the metal film is formed over the almost entire surface of the resin base in the first embodiment, the metal film is formed partially in the present embodiment. In the present embodiment, a metal film can be formed on the mount section where the semiconductor laser chip 101 is to be mounted in an amount required to enable radiation of heat generated in the semiconductor laser chip 101. Thus, when compared with the case where the metal film is formed over the almost-entire surface of the resin base, the amount of metal used can be reduced, so that manufacturing cost can be reduced.

Third Embodiment

Figure 5:
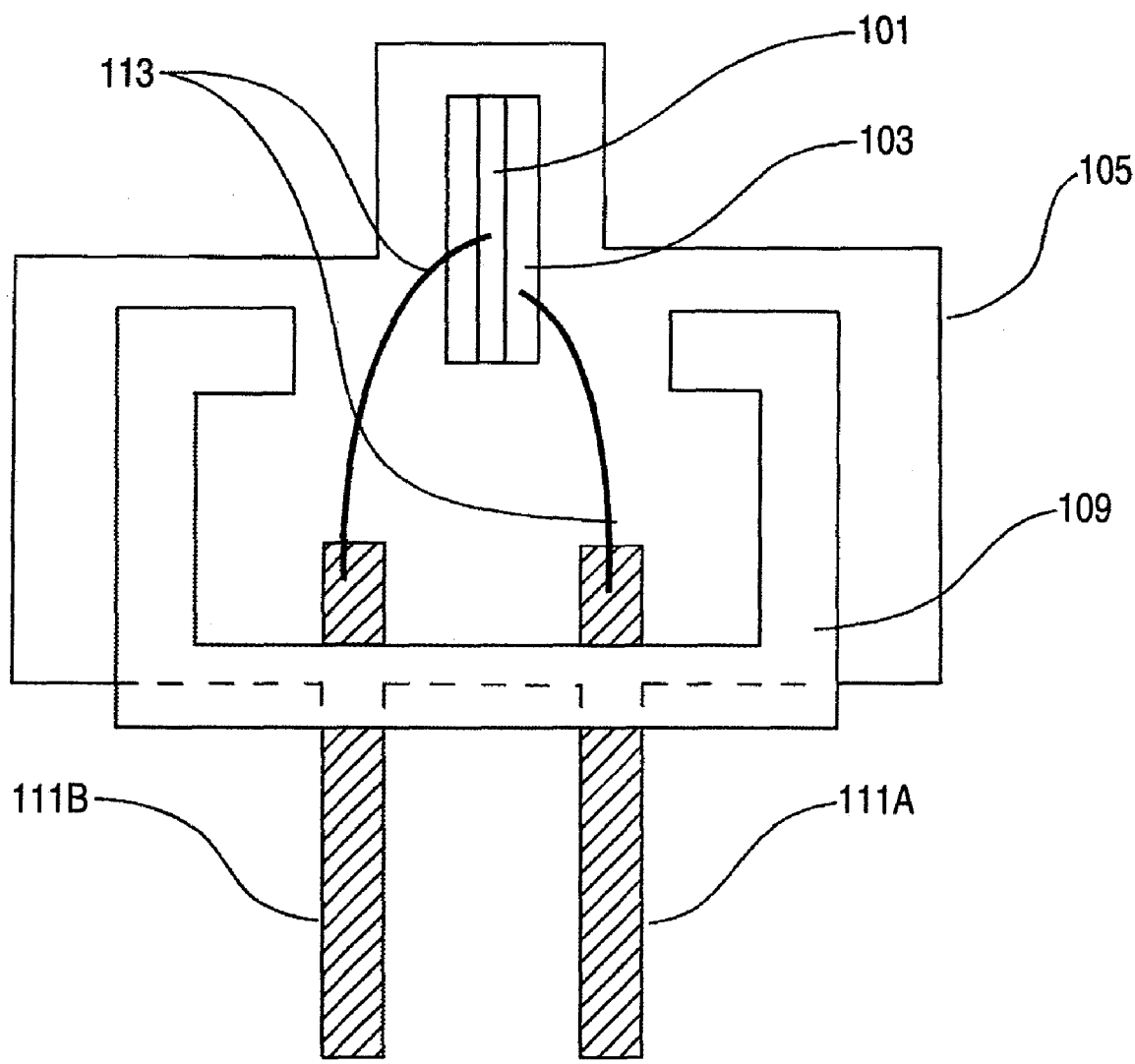
FIG. 5 is a schematic top view showing a semiconductor light-emitting device of a third embodiment of the present invention.

FIG. 5 is a schematic top view showing a semiconductor light-emitting device of a third embodiment of the present invention. When the semiconductor laser chip 101, which presents little problems in heat radiation, is mounted, the metal film for the mount section can be omitted. In this case, the areas requiring conductivity are only the lead sections. Therefore a metal film is formed in only such areas. Thus, an amount of metal used is reduced, so that manufacturing cost can be further reduced.

Fourth Embodiment

Figure 6:
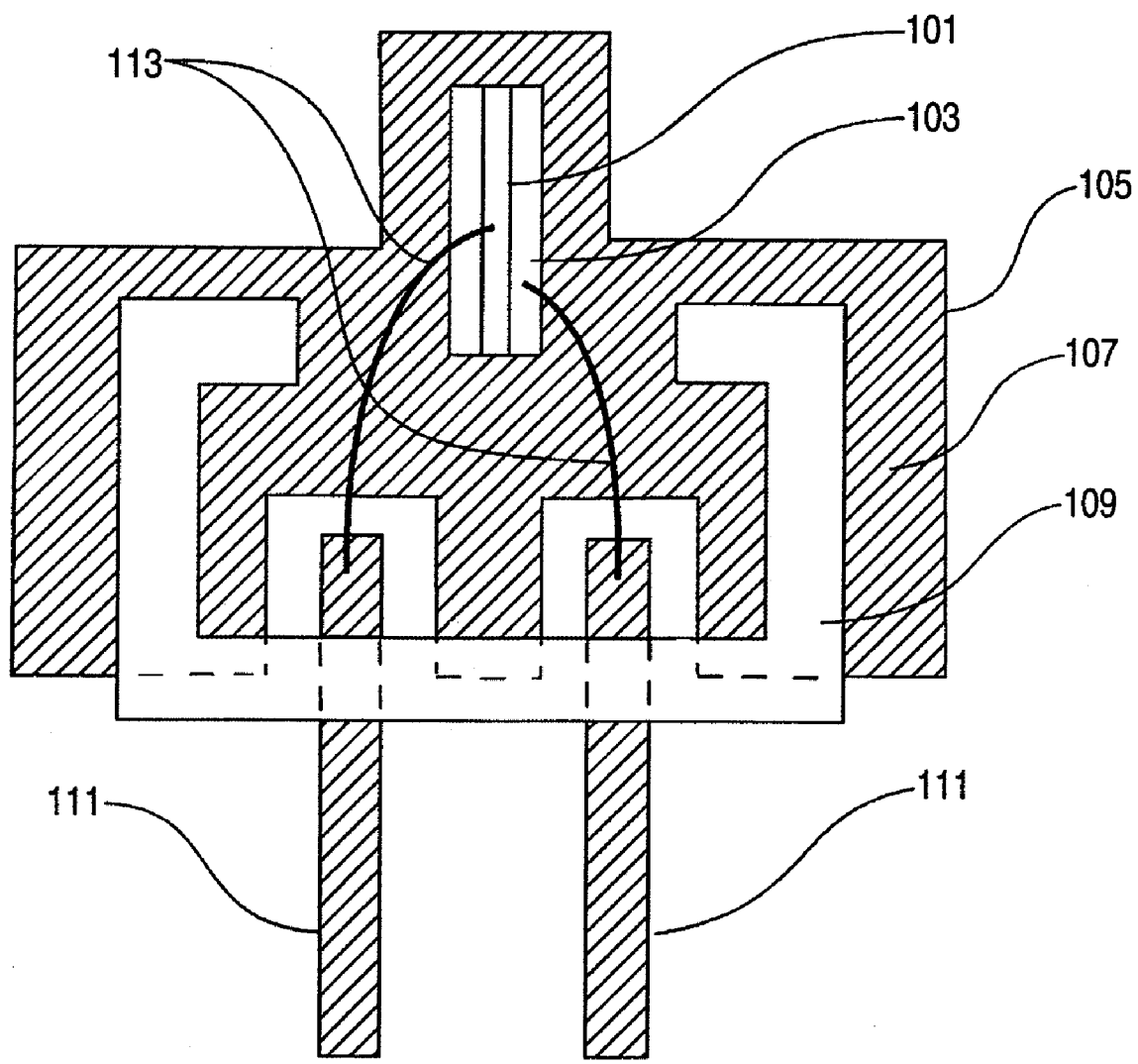
FIG. 6 is a schematic top view showing a semiconductor light-emitting device of a fourth embodiment of the present invention.

FIG. 6 is a schematic top view showing a semiconductor light-emitting device of a fourth embodiment of the present invention. In the first, second, and third embodiments, the lead and the frame are formed integrally with each other, and the lead section is also embodied as a lead by forming a metal film on a resin. In the fourth embodiment, a metal lead is used. The metal lead is insulated from the frame 105 configured by forming a metal film on the resin base and secured by a resin frame 109. In this case, it is required that the metal film 107 formed on the frame 105 is insulated from the lead 111. Therefore, when the metal film 107 is formed only on the mount section of the semiconductor laser chip 101, the resin base may be in contact with the metal lead 111. When the semiconductor laser chip 101, which presents little problems in a heat radiation characteristic, is mounted, the metal film 107 of the resin base can be omitted. In the case of reflow soldering, soldering is performed at a temperature around 230° C. to 250° C.; hence, a resin lead surface provided with a metal film can be used. However, soldering is usually performed at a temperature of about 300° C. Use of a metal lead allows soldering to be performed in higher temperature compared with reflow soldering.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. A semiconductor device package comprising:
a generally planar electrically insulating resin body having opposed first and second surfaces and including a frame section and first and second elongated lead sections projecting outwardly from the frame section;
a first metal film covering the first lead section and extending onto part of the first surface of the frame section; and
a second metal film covering the second lead section and projecting onto part of the first surface of the frame section, wherein the first and second metal films are electrically insulated from each other.

2. The semiconductor device package according to claim 1, further comprising a resin frame including arms, extending on both sides of the first and second surfaces of the frame section, and a side wall connected to the arms and through which the first and second lead sections and the first and second metal films pass.

3. The semiconductor device package according to claim 1, wherein the first metal film covers all of the first surface of the frame section except proximate the second metal film and is spaced from the second metal film.

4. The semiconductor device package according to claim 3, further comprising a resin frame including arms, extending on both sides of the first and second surfaces of the frame section, and a side wall connected to the arms and through which the first and second lead sections and the first and second metal films pass.

5. The semiconductor device package according to claim 1, wherein
- the resin body includes a third elongated lead section projecting outwardly from the frame section, and a third metal film covering the third lead section,
- the third metal film extends onto and covers the first surface of the frame section, except proximate the first and second metal films, and
- the third metal film is spaced from and electrically insulated from the first and second metal films.

6. The semiconductor device package according to claim 5, further comprising a resin frame including arms, extending on both sides of the first and second surfaces of the frame section, and a side wall connected to the arms and through which the first, second and third lead sections and the first, second, and third metal films pass.

7. The semiconductor device package according to claim 1, further comprising:
- a third metal film disposed on part of the first surface of the frame section, wherein the third metal film is spaced from and electrically insulated from the first and second metal films; and
- a resin frame including arms, extending on both sides of the first and second surfaces of the frame section, and a side wall connected to the arms and through which the first and second lead sections and the first and second metal films pass, wherein the frame is spaced from the third metal film.

8. The semiconductor device package according to claim 1, further comprising:
- a third metal film covering the first surface of the frame section, except proximate the first and second metal films, wherein the third metal film is spaced from and electrically insulated from the first and second metal films; and
- a resin frame including arms, extending on both sides of the first and second surfaces of the frame section, and a side wall connected to the arms and through which the first and second lead sections and first and second metal films pass, wherein the frame contacts the third metal film.

9. A semiconductor light-emitting device comprising:
- a generally planar electrically insulating resin body having opposed first and second surfaces and including a frame section and first and second elongated lead sections projecting outwardly from the frame section;
- a first metal film covering the first lead section and extending onto part of the first surface of the frame section;
- a second metal film covering the second lead section and projecting onto part of the first surface of the frame section, wherein the first and second metal films are electrically insulated from each other;
- a submount mounted at the first surface of the frame section;
- a semiconductor light-emitting element mounted on the submount; and
- respective wires electrically connecting the first and second metal films to the semiconductor light-emitting element.

10. The semiconductor light-emitting device according to claim 9, further comprising a resin frame including arms, extending on both sides of the first and second surfaces of the frame section, and a side wall connected to the arms and through which the first and second lead sections and the first and second metal films pass.

11. The semiconductor light-emitting device according to claim 9, wherein the first metal film covers all of the first surface of the frame section except proximate the second metal film and is spaced from the second metal film, wherein the first metal film is interposed between the submount and the first surface of the frame section.

12. The semiconductor light-emitting device according to claim 11, further comprising a resin frame including arms, extending on both sides of the first and second surfaces of the frame section, and a side wall connected to the arms and through which the first and second lead sections and the first and second metal films pass.

13. The semiconductor light-emitting device according to claim 9, wherein
- the resin body includes a third elongated lead section projecting outwardly from the frame section, and a third metal film covering the third lead section,
- the third metal film extends onto and covers the first surface of the frame section, except proximate the first and second metal films,
- the third metal film is spaced from and electrically insulated from the first and second metal films,
- the third metal film is interposed between the submount and the first surface of the frame section, and
- the semiconductor light-emitting device includes a wire electrically connecting the third metal film to the semiconductor light-emitting element.

14. The semiconductor light-emitting device according to claim 13, further comprising a resin frame including arms, extending on both sides of the first and second surfaces of the frame section, and a side wall connected to the arms and through which the first, second and third lead sections and the first, second, and third metal films pass.

15. The semiconductor light-emitting device according to claim 9, further comprising
- a third metal film disposed on part of the first surface of the frame section, wherein
  - the third metal film is spaced from and electrically insulated from the first and second metal films, and
  - the third metal film is interposed between the submount and the first surface of the frame section; and
- a resin frame including arms, extending on both sides of the first and second surfaces of the frame section, and a side wall connected to the arms and through which the first and second lead sections and first and second metal films pass, wherein the frame is spaced from the third metal film.

16. The semiconductor light-emitting device according to claim 9, further comprising:
- a third metal film covering the first surface of the frame section, except proximate the first and second metal films, wherein
  - the third metal film is spaced from and electrically insulated from the first and second metal films, and
  - the third metal film is interposed between the submount and the first surface of the frame section; and
- a resin frame including arms, extending on both sides of the first and second surfaces of the frame section, and a side wall connected to the arms and through which the first and second lead sections and the first and second metal films pass, wherein the frame contacts the third metal film.

\* \* \* \* \*